United States Patent [19]

Kuo

[11] Patent Number: 5,491,455
[45] Date of Patent: Feb. 13, 1996

[54] DIFFERENTIAL-TO-SINGLE ENDED TRANSLATOR THAT GENERATES AN OUTPUT SIGNAL WITH VERY SMALL SIGNAL DISTORTION

[75] Inventor: James R. Kuo, Cupertino, Calif.

[73] Assignee: National Semiconductor Corporation, Santa Clara, Calif.

[21] Appl. No.: 337,259

[22] Filed: Nov. 10, 1994

[51] Int. Cl.⁶ .................................................. H03F 3/45
[52] U.S. Cl. ........................................ 330/253; 330/257
[58] Field of Search .................................. 330/253, 257, 330/275, 301

[56] References Cited

U.S. PATENT DOCUMENTS

| | | | |
|---|---|---|---|
| 4,728,900 | 3/1988 | Nakagawara et al. | 330/253 |
| 5,276,369 | 1/1994 | Hayakawa et al. | 330/253 X |
| 5,337,007 | 8/1994 | Barrett, Jr. et al. | 330/253 |

FOREIGN PATENT DOCUMENTS

| | | | |
|---|---|---|---|
| 4209858 | 10/1992 | Germany | 330/253 |
| 143509 | 6/1987 | Japan | 330/253 |
| 297798 | 12/1990 | Japan | 330/253 |

OTHER PUBLICATIONS

Bipolar and MOS Analog Integrated Circuit Design, Alan B. Grebene, John Wiley & Sons, p. 281 1984.
1993 IEEE International Solid–State Circuits Conference, ISSCC, Section 6, Broadband Data Communications/ Paper TA 6.3, pp. 100–101, and Slide Supplement p. 75. See "CMOS ECL Receiver".

*Primary Examiner*—James B. Mullins
*Attorney, Agent, or Firm*—Limbach & Limbach

[57] ABSTRACT

A translator circuit amplifies a pair of differential input signals to produce a pair of intermediate differential signals by utilizing a pair of cross-coupled differential gain stages. The gain stages amplify the input signals to balance the capacitive loading. The pair of intermediate differential signals are formed to be substantially equal and 180° out of phase. The current sources of the gain stages are connected together and controlled by the outputs of the gain stages to reduce the rise and fall times of the intermediate differential signals. The translator circuit also converts the pair of intermediate differential signals to a single-ended output signal by utilizing a first differential pair to produce the output signal, and a second differential pair to adaptively control the current source of the first differential pair, thereby reducing the rise and fall times of the output signal. As a result, the translator circuit is capable of producing the output signal with minimum distortion. Therefore, a duty cycle of approximately 50% can be achieved.

13 Claims, 3 Drawing Sheets

DIFFERENTIAL-TO-SINGLE ENDED TRANSLATOR THAT GENERATES AN OUTPUT SIGNAL WITH VERY SMALL SIGNAL DISTORTION

BACKGROUND OF THE INVENTION

1. Field of the Invention

The present invention relates to differential-to-single ended translators and, in particular, to a differential-to-single ended translator that generates an output signal with very small signal distortion.

2. Description of the Related Art

A differential-to-single ended translator is a circuit that converts a pair of differential input signals into a single-ended output signal by amplifying the difference between the pair of differential input signals. FIG. 1 shows a schematic diagram that illustrates a conventional differential-to-single ended translator 10.

As shown in FIG. 1, when the voltage of input signal IN+ is larger than the voltage of input signal IN−, transistor M11 begins to sink a lesser portion of the current output by current source I, while transistor M12 begins to sink a correspondingly greater portion of the current.

The current sunk by transistor M11 is then sunk by transistor M13 which, in turn, is mirrored by transistor M14. As a result, when the voltage of input signal IN+ is greater than the voltage of input signal IN−, the current output by transistor M12 is greater than the current sunk by transistor M14. This difference in current causes a current to be sourced out of a first node N1 which, in turn, causes the voltage at the first node N1 to rise.

Similarly, when the voltage of input signal IN+ is less than the voltage of input signal IN−, the current output by transistor M12 is less than the current sunk by transistor M14. This difference in current causes a current to be sunk into the first node N1 which, in turn, causes the voltage at the first node N1 to fall.

When translator 10 is used to convert the differential signals output by a differential voltage controlled oscillator (VCO), such as a differential ring oscillator, into a single-ended oscillator signal, a number of problems arise. First, in order to meet the gain and speed requirements of the VCO, the size of transistors M11 and M12, along with the magnitude of the current source I, must be set to be relatively large because the transconductance of the differential pair is related to:

$$g_m = \sqrt{K \frac{W}{L} I}$$

where $g_m$ is the transconductance, K is a constant, W is the channel width of the transistor, and L is the channel length of the transistor.

The problem with utilizing a relatively large W/L, however, is that the larger the W/L, the greater the input capacitance. When the increased input capacitance is combined with the impedance of the input signal source, a low-pass filter is effectively formed at the gate of transistor M12 which, in turn, limits the high frequency response of the translator differential input pair. This is the so called "Miller effect" which is well known in the art. Thus, if the differential input signals IN+ and IN− are driven by a low-impedance voltage source, the high frequency response of transistor M12 is largely unaffected.

However, if the differential input signals IN+ and IN− are driven by a high-impedance voltage source, such as a differential CMOS VCO, the high frequency response of the translator differential input pair is severely limited. This, in turn, badly distorts the duty cycle of the voltage signal at the first node N1, thereby requiring additional circuitry to form an oscillator signal with a 50% duty cycle.

On the other hand, if the gain of the translator is limited to reduce the signal distortion caused by the Miller effect, translator 10 may lack the gain to drive a gate connected to the first node N1. Thus, when the differential input signals IN+ and IN− get too small, translator 10 may have no output at all at node N1.

Therefore, there is a need for a differential-to-single ended translator that can generate an output signal with very small signal distortion and which can drive a subsequent gate.

SUMMARY OF THE INVENTION

The present invention provides a balanced translator that converts a pair of differential input signals into a single-ended output signal which has minimal distortion by utilizing a pair of cross-coupled differential gain stages to produce a pair of intermediate differential signals, and by utilizing an adaptively controlled conversion stage to convert the intermediate signals into a single-ended signal.

A balanced translator in accordance with the present invention includes a first input amplifier and a second input amplifier. The first input amplifier amplifies the difference between the differential input signals, and outputs a first amplified signal in response thereto. The second input amplifier also amplifies the difference between the differential input signals, and outputs a second amplified signal in response thereto. In the present invention, the second amplified signal is formed to be substantially equivalent to and approximately 180° out of phase from the first amplified signal. The translator also includes a conversion circuit that converts the first amplified signal and the second amplified signal into the single-ended output signal by utilizing a first differential pair to produce the output signal, and a second differential pair to adaptively control the current source of the first differential pair, thereby reducing the rise and fall times of the output signal.

A better understanding of the features and advantages of the present invention will be obtained by reference to the following detailed description and accompanying drawings which set forth an illustrative embodiment in which the principles of the invention are utilized.

DETAILED DESCRIPTION

Figure 2:
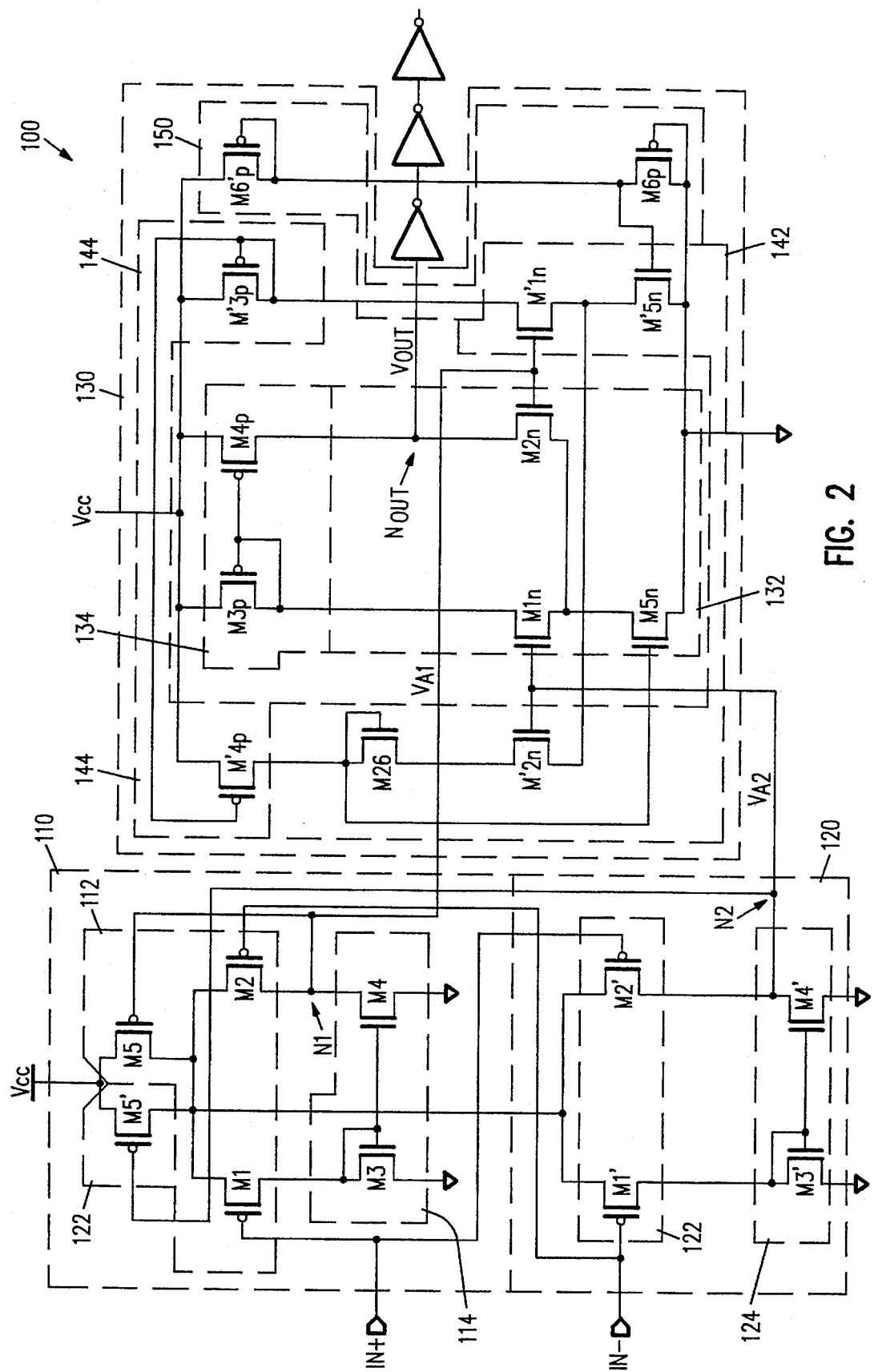
FIG. 2 is a schematic diagram illustrating a balanced translator 100 in accordance with the present invention.

FIG. 2 shows a schematic diagram that illustrates a balanced translator 100 in accordance with the present invention. As described in greater detail below, the present invention compensates for duty cycle distortion by utilizing a pair of cross-coupled input amplifiers which are driven by a common current source to produce an amplified pair of differential signals, and by utilizing a differential-to-single ended converter with a adaptive current source to produce an output signal with minimal distortion.

As shown in FIG. 2, translator 100 includes a pair of input amplifiers 110 and 120 that amplify the difference between a pair of differential input signals IN+ and IN–, and that output a pair of amplified signals $V_{A1}$ and $V_{A2}$, respectively, in response thereto. As shown, input amplifier 110 includes a differential gain stage 112, which is implemented with p-channel transistors M1, M2, and M5, and a current mirror subcircuit 114, which is implemented with n-channel transistors M3 and M4. Similarly, input amplifier 120 includes a differential gain stage 122, which is implemented with p-channel transistors M1', M2', and M5', and a current mirror subcircuit 124, which is implemented with n-channel transistors M3' and M4'.

In operation, when the voltages of differential input signals IN+ and IN– are equivalent, the current in both branches of amplifiers 110 and 120 are balanced. As a result, the incremental voltage of the amplified signals $V_{A1}$ and $V_{A2}$ are approximately zero due to the common mode rejection of amplifiers 110 and 120. As the voltages vary, however, one of the transistors M1 and M2 in amplifier 110, and one of the transistors M1' and M2' in amplifier 120, begin to sink more current, while the remaining transistor M1 and M2, and M1' and M2', respectively, begin to sink less current.

Thus, for example, as the voltage of input signal IN+ incrementally increases and the voltage of input signal IN– incrementally decreases, transistor M1 begins to sink a lesser portion of the current output by transistor M5, whose gate is controlled by the drain of transistor M4 of the differential pair, while transistor M2 begins to sink a correspondingly greater portion of the current.

The current sunk by transistor M1 is then sunk by transistor M3 of current mirror subcircuit 114 which, in turn, is mirrored by transistor M4. As a result, when the voltage of input signal IN+ is greater than the voltage of input signal IN–, the current output by transistor M2 is greater than the current sunk by transistor M4. This difference in current causes a current to be sourced out of a first node N1 which, in turn, causes the voltage of the amplified signal $V_{A1}$ to rise.

At the same time, transistor M1' begins to sink a greater portion of the current output by transistor M5', whose gate is controlled by the drain of transistor M4' of the differential pair, while transistor M2' begins to sink a correspondingly lesser portion of the current.

The current sunk by transistor M1' is then sunk by transistor M3' of current mirror subcircuit 124 which, in turn, is mirrored by transistor M4'. As a result, when the voltage of input signal IN+ is greater than the voltage of input signal IN–, the current output by transistor M2' is less than the current sunk by transistor M4'. This difference in current causes a current to be sunk into a second node N2 which, in turn, causes the voltage of the amplified signal $V_{A2}$ to fall.

On the other hand, when the voltage of input signal IN+ is less than the voltage of input signal IN–, the current output by transistor M2 is less than the current sunk by transistor M4. This difference in current causes a current to be sunk into the first node N1 which, in turn, causes the voltage of amplified signal $V_{A1}$ to fall. At the same time, the current output by transistor M2' is greater than the current sunk by transistor M4'. This difference in current causes a current to be sourced out of the second node N2 which, in turn, causes the voltage of amplified signal $V_{A2}$ to rise.

An important point to note is that the drains of transistors M5 and M5' are connected together so that both differential pairs share current together. As shown in FIG. 2, the two tail current sources M5 and M5' are self-biased by their own outputs, i.e., the gate of transistor M5 is controlled by the drain of transistor M4, while the gate of transistor M5' is controlled by the drain of transistor M4'. Thus, since the two outputs at nodes N1 and N2 are complementary, only one tail current source is conducting. As a result, a balanced input stage formed from amplifiers 110 and 120 will always draw a constant current from the supply Vcc. This, in turn, produces less inductive noise from the chip supply bonding wire.

If the drains of transistors M5 and M5' were not connected together, the rise of amplified signal $V_{A1}$ would reduce the current supplied by transistor M5, thereby slowing the rising edge of the amplified signal $V_{A1}$. However, by connecting the drains together, this problem can be eliminated.

As shown, as the voltage of the amplified signal $V_{A1}$ rises, the voltage of the amplified signal $V_{A2}$ falls. This, in turn, increases the current sourced by transistor M5' since the gate of transistor M5' is connected to the amplified signal $V_{A2}$. Thus, by sharing current sources, transistor M2 is able to source more current even though transistor M5 is sourcing less current.

Thus, the rise and fall times of the amplified signals $V_{A1}$ and $V_{A2}$ can be improved, thereby reducing signal distortion. As a result, a duty cycle of approximately 50% can be maintained in clock generation applications. In addition, the delay time from the input to the output of the input amplifiers 110 and 120 is also reduced. Experimental results have demonstrated a delay of 400 picoseconds.

Figure 3:
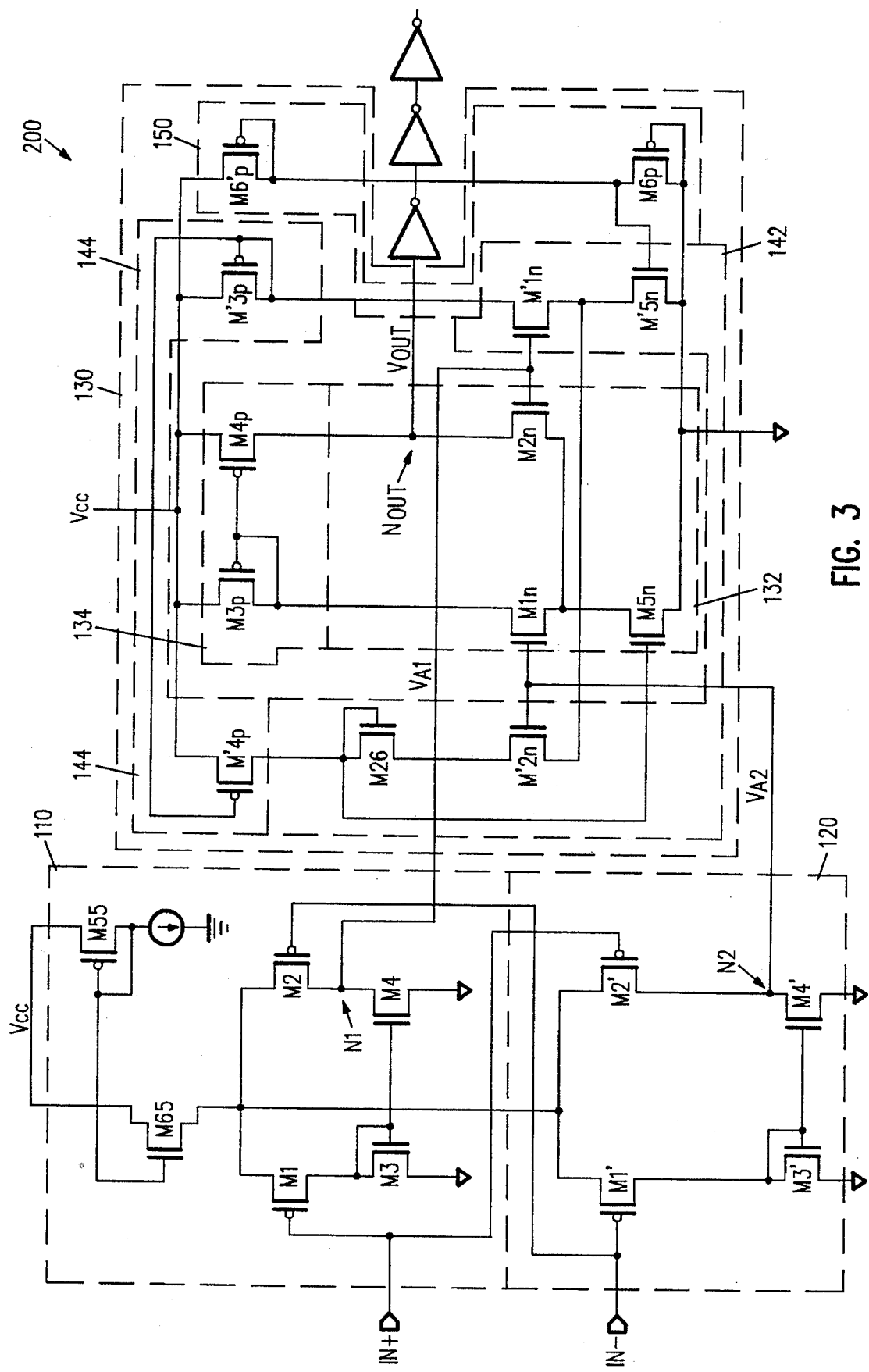
FIG. 3 is a schematic diagram illustrating a balanced translator 200 in accordance with a second embodiment of the present invention.

Alternately, as shown in FIG. 3, transistors M5 and M5' can be combined to form a constant current source. The advantage of utilizing both transistors M5 and M5' in the FIG. 2 embodiment is that, as shown in FIG. 3, the reference current source can be eliminated. On the other hand, the advantage of utilizing a constant current source is that the gates of transistors M5 and M5' no longer need to be connected to nodes 1 and 2, respectively. By eliminating these connections, the capacitance at nodes 1 and 2 can be reduced.

Figure 1:
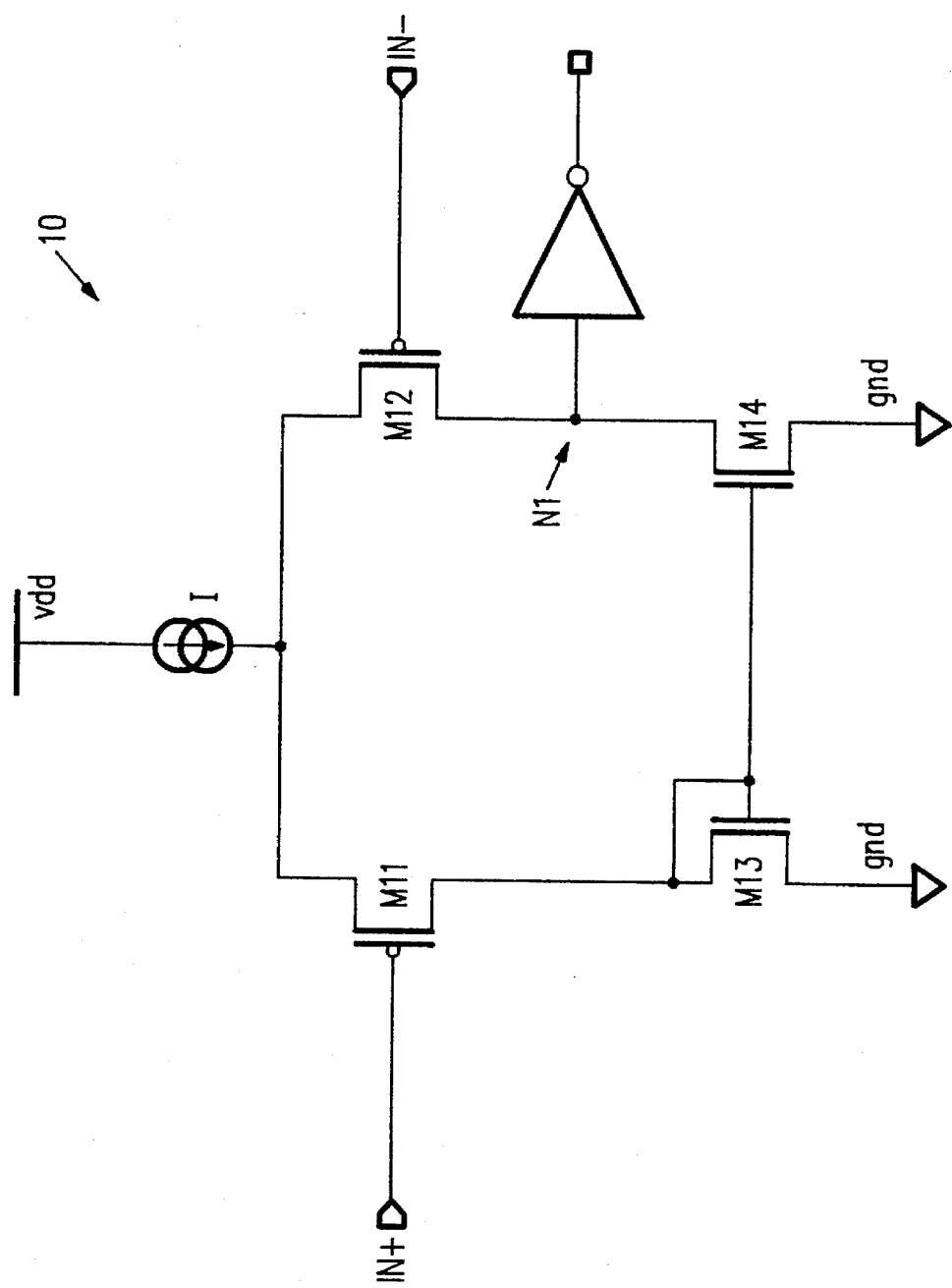
FIG. 1 is a schematic diagram illustrating a conventional differential-to-single ended translator 10.

As discussed above, when the differential input signals IN+ and IN– are driven by a high impedance voltage source, such as a differential CMOS voltage controlled oscillator (VCO), the Miller effect causes a greater effective input capacitance to be present at the gate of transistor M12 (see FIG. 1) than is present at the gate of transistor M11. As a result, the input signal IN– must drive a greater capacitive load than the input signal IN+. This additional capacitance skews the amplified signal which, in turn, alters the duty cycle of the signal.

In accordance with the present invention, the Miller effect is compensated for by cross-coupling the inputs of amplifiers 110 and 120. As a result, the Miller effect is effectively balanced. Thus, by connecting the input signal IN+ to the gate of transistors M1 and M2', and the input signal IN– to the gate of transistors M1' and M2, the present invention provides a pair of amplified signals $V_{A1}$ and $V_{A2}$ which are substantially equal and 180° out of phase.

Referring again to FIG. 2, translator 100 also includes a conversion circuit 130 that converts the amplified signals $V_{A1}$ and $V_{A2}$ present at the first and second nodes N1 and N2, respectively, into a single-ended output voltage $V_{OUT}$. As shown, conversion circuit 130 includes a pair of differential gain stages 132 and 142, a pair of current mirror subcircuits 134 and 144, respectively, and a voltage divider 150.

Differential gain stage 132 is implemented with a current source transistor M5n and n-channel transistors M1n and M2n, while current mirror subcircuit 134 is implemented with p-channel transistors M3p and M4p. Similarly, differential gain stage 142 is implemented with a current source transistor M'5n and n-channel transistors M'1n, M'2n, and M26, while current mirror subcircuit 144 is implemented with p-channel transistors M'3p and M'4p. In addition, voltage divider 150 is implemented with p-channel transistors M6p and M'6p.

In operation, voltage divider 150 establishes the gate voltage of the current source transistor M'5n which, in turn, establishes the current flow through differential gain stage 142. As shown, the current flow through differential gain stage 132 is established by transistor M5n.

As the voltage of the amplified signal $V_{A1}$ at node N1 incrementally decreases and the voltage of the amplified signal $V_{A2}$ at node N2 incrementally increases, transistors M1n and M'2n begin to source a greater portion of the current sunk by transistors M5n and M'5n, respectively, while transistors M2n and M'1n begin to source a correspondingly lesser portion of the current.

The current sunk by transistor M1n is sourced by transistor M3p of current mirror subcircuit 134 which, in turn, is mirrored by transistor M4p. As a result, when the voltage of the amplified signal $V_{A1}$ at node N1 is less than the voltage of the amplified signal $V_{A2}$ at node N2, the current output by transistor M4p is greater than the current sunk by transistor M2n. This difference in current causes a current to be sourced out of the output node $N_{OUT}$ which, in turn, causes the voltage at the output node $N_{OUT}$ to rise.

At the same time, the current sunk by transistor M'1n is sourced by transistor M'3p of current mirror subcircuit 134 which, in turn, is mirrored by transistor M'4p. As a result, when the voltage of the amplified signal $V_{A1}$ at node N1 is less than the voltage of the amplified signal $V_{A2}$ at node N2, the current output by transistor M'4p is less than the current sunk by transistor M'2n. This difference in current causes the voltage at the drain of transistor M26 to fall.

As shown in FIG. 2, the drain of transistor M26 is connected to the gate of the current source transistor M5n. Thus, the falling voltage at the drain of transistor M26 causes the current source transistor M5n to sink less current. This, in turn, causes the voltage at the output node $N_{OUT}$ to rise more quickly. Thus, by using the state of the output voltage $V_{OUT}$ to indirectly control the tail current sunk by transistor M5n, the rising and falling times of the output voltage $V_{OUT}$ can be improved, thereby insuring that the output voltage $V_{OUT}$ has a small distortion. As a result, the present invention insures that a duty cycle of approximately 50% can be maintained in clock generation applications.

Although differential gain stage 142 is implemented with transistor M26, the circuit will operate without this transistor. Transistor M26, however, speeds up the turn on of transistor M5n so that the rise and fall times of the output signal $V_{OUT}$ are symmetrical. Experimental results with transistor M26 included have demonstrated a delay of 400 picoseconds from node N1 to the output node $N_{OUT}$.

Similarly, as the voltage of the amplified signal $V_{A1}$ at node N1 incrementally increases and the voltage of the amplified signal $V_{A2}$ at node N2 incrementally decreases, transistors M1n and M'2n begin to source a lesser portion of the current sunk by transistors M5n and M'5n, respectively, while transistors M2n and M'1n begin to source a correspondingly greater portion of the current.

This, in turn, causes the voltage at the output node $N_{OUT}$ to fall, while the voltage at the drain of transistor M26 rises.

The rising drain voltage causes current source transistor M5n to turn on harder which, in turn, causes the voltage at the output node $N_{OUT}$ to fall faster.

Another factor which controls the rise and fall times of the output voltage $V_{OUT}$ is the capacitive loading which is present at the output node $N_{OUT}$ that results from a gate connected to the output node $N_{OUT}$. In the present invention, the transistors are sized so that the output voltage $V_{OUT}$ can drive a small CMOS gate without buffers. If a CMOS gate with a larger capacitive loading is required, one or more buffers can be connected in series to the output node $N_{OUT}$ to increase the current drive capability. FIG. 2 shows the present invention connected to three buffers.

As stated above, the delay through the input amplifiers 110 and 120 is approximately 400 picoseconds, while the delay through converter 130 is also approximately 400 picoseconds. Thus, if a gate with a small capacitive loading is connected to the output node $N_{OUT}$, the total delay of translator is less than 1 nanosecond. Even if three buffers are utilized, as shown in FIG. 2, the total delay is approximately 1.6 nanoseconds. In addition, since the output signal $V_{OUT}$ is generated with approximately a 50% duty cycle, there is no need to use a toggle flip-flop to generate a 50% duty cycle clock output as is commonly the case.

Another advantage of the present invention is that, as a result of utilizing differential gain stages 112, 122, 132, and 142, the duty cycle of the output signal $V_{OUT}$ is independent of variations in the power supply, temperature, and process conditions e.g., the beta and transconductance of the transistors.

It should be understood that various alternatives to the embodiment of the invention described herein may be employed in practicing the present invention. It is intended that the following claims define the scope of the invention and that methods and structures within the scope of these claims and their equivalents be covered thereby.

What is claimed is:

1. A translator for converting a pair of input signals into a single-ended output signal, the translator comprising:

a first input amplifier that amplifies the difference between the pair of input signals, and outputs a first amplified signal in response thereto, the first input amplifier including:
a first current source having an output,
a first differential pair connected to the output of the first current source, the first differential pair having an output node, and
a first current mirror subcircuit connected to the first differential pair;

a second input amplifier that amplifies the difference between the pair of input signals, and outputs a second amplified signal in response thereto, the second amplified signal being approximately 180° out of phase from the first amplified signal, the second input amplifier including:
a second current source having an output,
a second differential pair connected to the output of the second current source, the second differential pair having an output node, and
a second current mirror subcircuit connected to the second differential pair; and a conversion circuit that converts the first amplified signal and the second amplified signal into the single-ended output signal, wherein the output of the first current source is connected to the output of the second current source.

2. The translator of claim 1 wherein the first current source includes a first transistor having a gate, and wherein the second current source includes a second transistor having a gate, and
   wherein the output node of the first differential pair is connected to the gate of the first transistor.

3. The translator of claim 2 wherein the output node of the second differential pair is connected to the gate of the second transistor.

4. A translator for converting a pair of input signals into a single-ended output signal, the translator comprising:
   a first input amplifier that amplifies the difference between the pair of input signals, and outputs a first amplified signal in response thereto;
   a second input amplifier that amplifies the difference between the pair of input signals, and outputs a second amplified signal in response thereto, the second amplified signal being approximately 180° out of phase from the first amplified signal; and
   a conversion circuit that converts the first amplified signal and the second amplified signal into the single-ended output signal, the conversion circuit including:
      a first conversion amplifier that amplifies the difference between the first amplified signal and the second amplified signal, and outputs an output signal in response thereto;
      a second conversion amplifier connected to the first conversion amplifier that amplifies the difference between the first amplified signal and the second amplified signal, and outputs an intermediate signal in response thereto, the intermediate signal controlling the rise and fall times of the output signal, the second conversion amplifier having a tail current; and
      a voltage divider connected to the second conversion amplifier that controls the tail current.

5. A translator for converting a pair of input signals into a single-ended output signal, the translator comprising:
   a first input amplifier that amplifies the difference between the pair of input signals, and outputs a first amplified signal in response thereto;
   a second input amplifier that amplifies the difference between the pair of input signals, and outputs a second amplified signal in response thereto, the second amplified signal being approximately 180° out of phase from the first amplified signal; and
   a conversion circuit that converts the first amplified signal and the second amplified signal into the single-ended output signal, the conversion circuit including:
      a first conversion amplifier that amplifies the difference between the first amplified signal and the second amplified signal, and outputs an output signal in response thereto, the first conversion amplifier including:
         a first current source having an input;
         a first differential pair connected to the input of the first current source, the first differential pair having an output node; and
         a first current mirror subcircuit connected to the first differential pair;
      a second conversion amplifier connected to the first conversion amplifier that amplifies the difference between the first amplified signal and the second amplified signal, and outputs an intermediate signal in response thereto, the intermediate signal controlling the rise and fall times of the output signal, the second conversion amplifier having a tail current; and
      a voltage divider connected to the second conversion amplifier that controls the tail current.

6. The translator of claim 5 wherein the second input amplifier includes:
   a second current source having an input;
   a second differential pair connected to the input of the second current source, the second differential pair having an output node; and
   a second current mirror subcircuit connected to the second differential pair.

7. The translator of claim 6 wherein the first current source includes a first transistor having a gate, and wherein the second current source includes a second transistor having a gate.

8. The translator of claim 7 wherein the voltage divider is connected to the gate of the second transistor.

9. The translator of claim 8 wherein the output node of the second differential pair is connected to the gate of the first transistor.

10. A method for converting a pair of input signals into a single-ended output signal, the method comprising the steps of:
    amplifying the difference between the pair of input signals, and outputting a first amplified signal in response thereto;
    amplifying the difference between the pair of input signals, and outputting a second amplified signal in response thereto, the second amplified signal being approximately 180° out of phase from the first amplified signal; and
    converting the first amplified signal and the second amplified signal into the single-ended output signal by:
       amplifying the difference between the first amplified signal and the second amplified signal, and outputting an output signal in response thereto; and
       amplifying the difference between the first amplified signal and the second amplified signal, and outputting an intermediate signal in response thereto, the intermediate signal controlling the rise and fall times of the output signal.

11. A translator for converting a pair of input signals into a single-ended output signal, the translator comprising:
    a first conversion amplifier that amplifies the difference between a first input signal and a second input signal, and outputs an output signal in response thereto;
    a second conversion amplifier connected to the first conversion amplifier that amplifies the difference between the first input signal and the second input signal, and outputs an intermediate signal in response thereto, the intermediate signal controlling the rise and fall times of the output signal, the second conversion amplifier having a tail current; and
    a voltage divider connected to the second conversion amplifier that outputs a constant voltage that controls the tail current.

12. A translator for converting a pair of input signals into a single-ended output signal, the translator comprising:
    a first conversion amplifier that amplifies the difference between a first input signal and a second input signal, and outputs an output signal in response thereto, the first conversion amplifier including:
       a first current source having an input;
       a first differential pair connected to the input of the first current source, the first differential pair having an output node; and a first current mirror subcircuit connected to the first differential pair, wherein the second input amplifier includes:
   a second current source having an input;
   a second differential pair connected to the input of the second current source, the second differential pair having an output node; and
   a second current mirror subcircuit connected to the second differential pair, wherein the first current source includes a first transistor having a gate, and wherein the second current source includes a second transistor having a gate, and wherein the output node of the second differential pair is connected to the gate of the first transistor;

a second conversion amplifier connected to the first conversion amplifier that amplifies the difference between the first input signal and the second input signal, and outputs an intermediate signal in response thereto, the intermediate signal controlling the rise and fall times of the output signal, the second conversion amplifier having a tail current; and a voltage divider connected to the second conversion amplifier that controls the tail current.

13. A translator for converting a pair of input signals into a single-ended output signal, the translator comprising:

a single constant current source having an output;

a first input amplifier that amplifies the difference between the pair of input signals, and outputs a first amplified signal in response thereto, wherein the first input amplifier includes:
   a first differential pair connected to the output of the current source, the first differential pair having an output node; and
   a first current mirror subcircuit connected to the first differential pair; and a second input amplifier that amplifies the difference between the pair of input signals, and outputs a second amplified signal in response thereto, the second amplified signal being approximately 180° out of phase from the first amplified signal, wherein the second input amplifier includes:
   a second differential pair connected to the output of the current source, the second differential pair having an output node; and
   a second current mirror subcircuit connected to the second differential pair.

* * * * *